(12) United States Patent
Choudhury et al.

(10) Patent No.: US 9,477,275 B2
(45) Date of Patent: Oct. 25, 2016

(54) THERMAL MANAGEMENT SOLUTION FOR CIRCUIT PRODUCTS

(71) Applicants: Arnab Choudhury, Chandler, AZ (US); Je-Young Chang, Phoenix, AZ (US); David W. Song, Chandler, AZ (US); Edvin Cetegen, Chandler, AZ (US); Ashish Gupta, Chandler, AZ (US)

(72) Inventors: Arnab Choudhury, Chandler, AZ (US); Je-Young Chang, Phoenix, AZ (US); David W. Song, Chandler, AZ (US); Edvin Cetegen, Chandler, AZ (US); Ashish Gupta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 455 days.

(21) Appl. No.: 13/745,553

(22) Filed: Jan. 18, 2013

(65) Prior Publication Data

US 2014/0204534 A1 Jul. 24, 2014

(51) Int. Cl.
*H01L 23/473* (2006.01)
*H05K 7/20* (2006.01)
*G06F 1/20* (2006.01)
*H01L 23/433* (2006.01)

(52) U.S. Cl.
CPC .......... *G06F 1/206* (2013.01); *H01L 23/4336* (2013.01); *H01L 23/4735* (2013.01); *F28F 2260/02* (2013.01); *G06F 2200/201* (2013.01)

(58) Field of Classification Search
CPC ............. H01L 23/4336; H01L 23/473; H01L 23/4735; F28F 2260/02
See application file for complete search history.

(56) References Cited

U.S. PATENT DOCUMENTS

| | | | | |
|---|---|---|---|---|
| 5,218,515 A * | 6/1993 | Bernhardt | ............. | H01L 23/473 257/712 |
| 5,727,618 A * | 3/1998 | Mundinger | ............. | F28F 3/086 165/185 |
| 6,986,382 B2 * | 1/2006 | Upadhya | ............... | F04B 19/006 165/104.21 |
| 7,139,172 B2 * | 11/2006 | Bezama | .................... | F28F 3/04 165/80.4 |
| 7,190,580 B2 * | 3/2007 | Bezama | .................... | F28F 3/12 165/80.4 |
| 7,255,153 B2 * | 8/2007 | Berger | ................ | H01L 23/4735 165/80.4 |
| 7,277,283 B2 * | 10/2007 | Campbell | ........... | H01L 23/4735 165/80.4 |
| 7,331,378 B2 * | 2/2008 | Bhatti | ..................... | F28F 9/026 165/80.4 |
| 7,516,776 B2 * | 4/2009 | Bezama et al. | ............... | 165/80.4 |

(Continued)

*Primary Examiner* — Robert J Hoffberg
(74) *Attorney, Agent, or Firm* — Blakely, Sokoloff, Taylor & Zafman LLP

(57) ABSTRACT

An apparatus including a cold plate body; a channel module disposed within the cold plate body including a channel body and a plurality of channels projecting through the channel body; and a manifold disposed on the channel module, the manifold including an inlet and an outlet and a first plurality of apertures in fluid communication with the inlet and a second plurality of apertures are in fluid communication with the outlet. A method including introducing a fluid to an integrated cold plate disposed on an integrated circuit device, the integrated cold plate comprising a cold plate body extending about the device, the fluid being introduced into a manifold in fluid communication with a channel module disposed between the manifold and a base plate, the channel module, and including channels to direct the fluid toward the base plate, and collecting the fluid returned to the manifold.

17 Claims, 5 Drawing Sheets

(56) References Cited

U.S. PATENT DOCUMENTS

| | | | |
|---|---|---|---|
| 7,762,314 B2 * | 7/2010 | Campbell | F28F 3/02 165/80.3 |
| 7,808,780 B2 * | 10/2010 | Brunschwiler et al. | 361/679.53 |
| 7,808,781 B2 * | 10/2010 | Colgan et al. | 361/699 |
| 7,866,173 B2 * | 1/2011 | Brunschwiler et al. | 62/185 |
| 7,992,627 B2 * | 8/2011 | Bezama et al. | 165/80.4 |
| 8,004,832 B2 * | 8/2011 | Brunschwiler et al. | 361/679.53 |
| 8,107,234 B2 * | 1/2012 | Brunschwiler et al. | 361/679.53 |
| 8,479,806 B2 * | 7/2013 | Qu | F28F 3/048 165/80.4 |
| 9,061,382 B2 * | 6/2015 | Campbell | H05K 7/2029 |
| 9,061,383 B2 * | 6/2015 | Campbell | H05K 7/2029 |
| 9,067,288 B2 * | 6/2015 | Campbell | H05K 7/2029 |
| 9,069,532 B2 * | 6/2015 | Campbell | H05K 7/2029 |
| 9,075,582 B2 * | 7/2015 | Campbell | H05K 7/2029 |
| 9,078,379 B2 * | 7/2015 | Campbell | H05K 7/20309 |
| 9,089,936 B2 * | 7/2015 | Campbell | H05K 7/2029 |
| 9,102,021 B2 * | 8/2015 | Campbell | H05K 7/2029 |
| 9,113,581 B2 * | 8/2015 | Campbell | H05K 7/2029 |
| 9,347,987 B2 * | 5/2016 | Schroeder | G01R 31/2875 |
| 2006/0096738 A1 * | 5/2006 | Kang | F28F 3/022 165/80.4 |
| 2011/0109335 A1 | 5/2011 | Schroeder | |
| 2015/0034280 A1 * | 2/2015 | Himmelmann | F28D 15/00 165/104.33 |
| 2015/0285857 A1 * | 10/2015 | Schroeder | G01R 31/2875 324/750.08 |

* cited by examiner

THERMAL MANAGEMENT SOLUTION FOR CIRCUIT PRODUCTS

FIELD

Thermal management for integrated circuit devices.

BACKGROUND

Decreasing feature sizes and increasing package densities are making thermal issues important in integrated circuit related products, particularly high power products such as server products. The total thermal design power is increasing with respect to generation which demands that cross-plane heat removal be improved. Still further, the emergence of multi-chip packages (MCPs) in, for example, high-power servers where, for example, multi-chip dynamic random access memory (MC-DRAM) stacked packages currently generate approximately nine watts to 10 watts of power and come coated with die backside film polymeric layers that present a high thermal resistance that is difficult to compensate for with traditional air cooling.

Many high-power central processing unit (CPU) products use an integrated heat spreader (IHS) as a lid over the die (e.g., a silicon die or dies). Onto this lid mounts a thermal solution, such as a passive heat sink, a heat sink/fan combination or liquid cooling solution. Limitations of these configurations include a relatively large stack-up height and multiple thermal interfaces where thermal interface material (TIM) must be applied. Thermal performance of TIM materials have been optimized yet a need still remains to improve the thermal management of high-power microprocessors.

DETAILED DESCRIPTION

Figure 1:
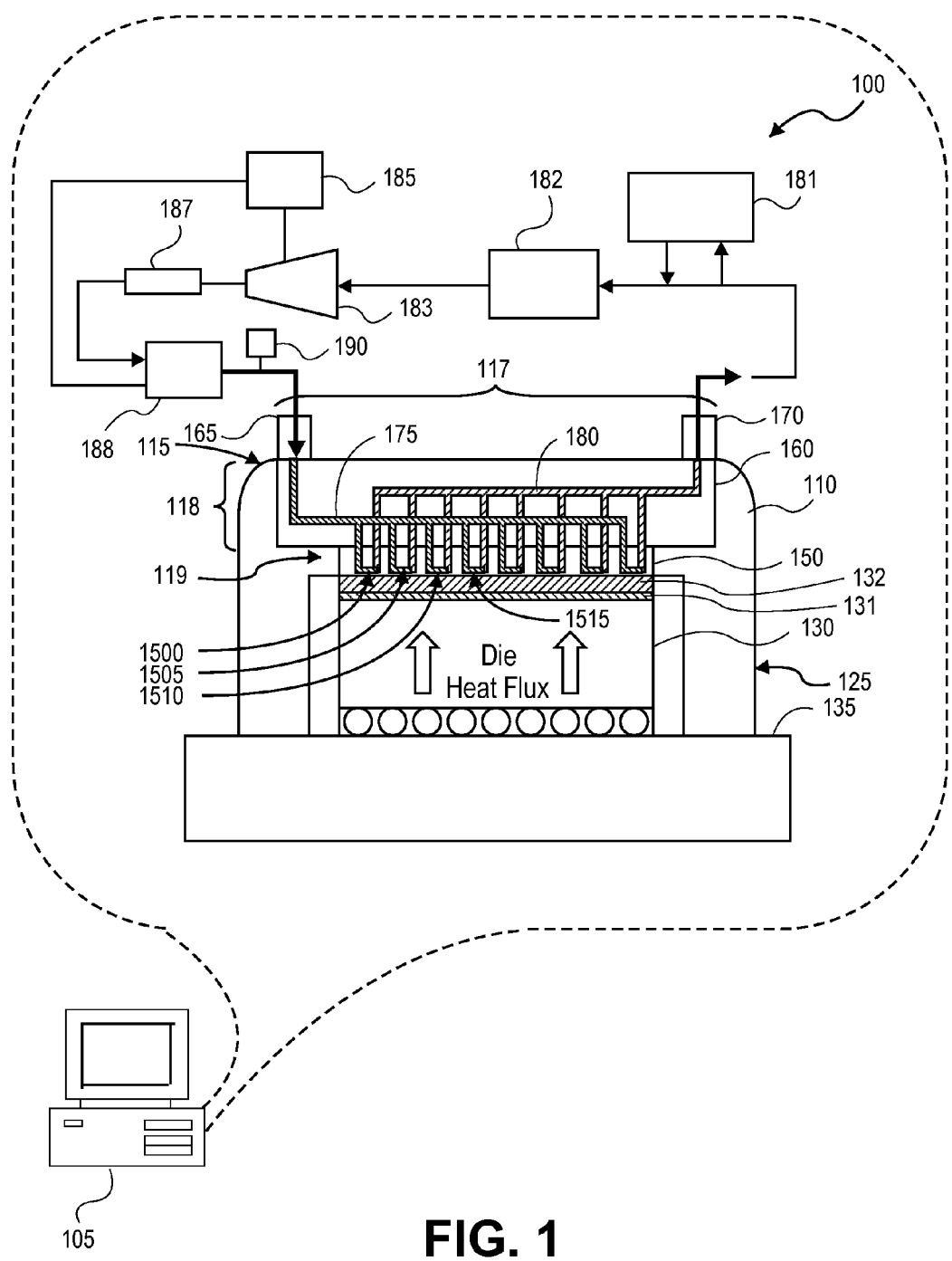
FIG. 1 is a cross-sectional and schematic side view of a processing system and an exploded schematic cross-sectional side view of a portion of a printed circuit board including an embodiment of an integrated cold plate assembly including a thermal solution including channel module and manifold over a die, such as a central processing unit.
Figure 2A:
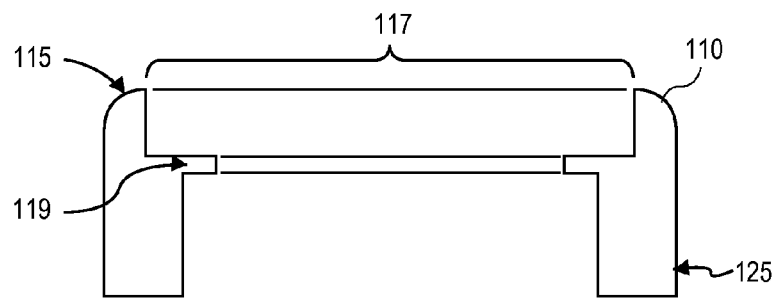
FIG. 2A is a side view of a base plate of an integrated cold plate.
Figure 2B:
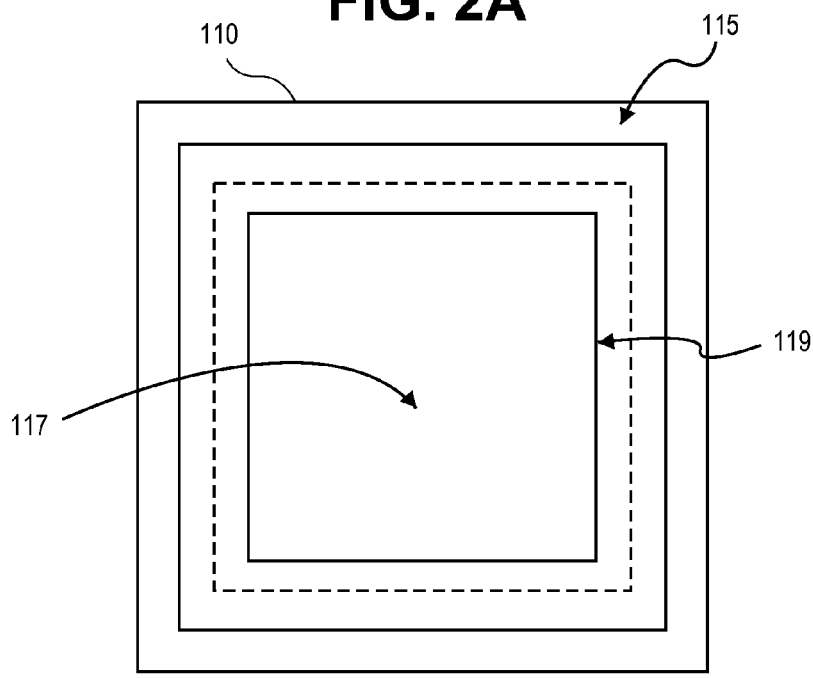
FIG. 2B is a top view of the base plate of FIG. 2A.
Figure 2C:
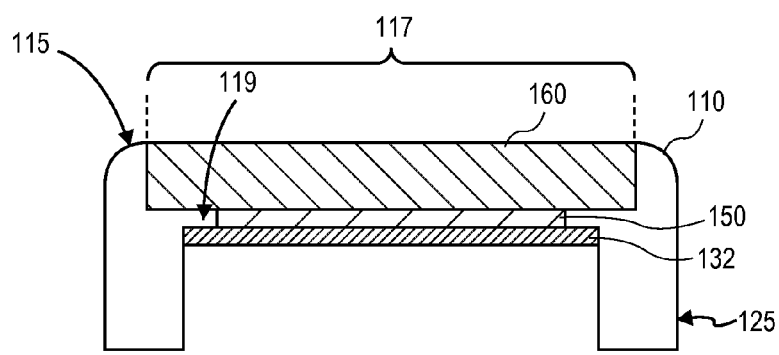
FIG. 2C is a side view of an assembly of an integrated cold plate assembly and shows a channel module, a manifold and a base plate assembled in the cold plate body of FIG. 2A.

FIG. 1 shows a cross-sectional and schematic side view of an embodiment of an apparatus that includes a thermal solution identified as an integrated cold plate. Apparatus 100 includes cold plate body 110 including a cap portion disposed over an integrated circuit die 130 such as a CPU or multiple dies (e.g., a MCP). FIG. 1 shows die 130 connected to printed circuit board 135. Cold plate body 110 of an integrated cold plate is a body of a material compatible with a package assembly process and structurally strong. An example of a suitable metal material is copper. Cold plate body 110, in one embodiment, has a generally rectangular shape defined by cap portion 115 defining a superior surface (as viewed). Cold plate body 110 also includes sidewall portion 125 that extends from cap portion 115 to printed circuit board 135 to define a volume to accommodate die 130 within a volume defined by cap portion 115 and sidewall portion 125. Overlying a surface of die 130 between the die and cold plate body 110 is thermal interface material (TIM).

In one embodiment, a thermal solution is integrated into cold plate body 110. In this manner, as shown in FIG. 1 and FIGS. 2A-2C, cap portion 115 of cold plate body 110 has opening 117 formed therein. Cold plate body 110 also includes shelf portion 119 below a superior surface and protruding a distance inward (as viewed). Disposed in opening 117 in cap portion 115 of the cold plate body 110 is channel module 150 and manifold 160. In this embodiment, manifold 160 extends depth 118 to shelf portion 119 and channel module 150 is below manifold 160 (as viewed). Channel module 150 has dimensions such that, in this embodiment, it is disposed within the opening defined by shelf 119 to contact manifold 160. Below channel module 150 is base plate 132. Base plate 132 is a plate of a thermally conductive material such as copper having a representative thickness on the order of 100 μm to 500 μm. Channel module 150 is also a thermally conductive material (e.g., copper) that is bonded to base plate 132 by way of, for example, a diffusion bonding. Manifold may also be formed of a thermally conductive material to limit heat transfer between a manifold inlet (inlet 165) and a manifold outlet (outlet 170). In one embodiment, manifold is a material such as stainless steel or a thermoplastic polyetherimide (Utem™ resin). The stacked channel module 150 and base plate 132 are introduced into cold plate body 110 from below and bonding base plate 132 to a base of shelf 119. Manifold 160 which is introduced from above cold plate body 110 into opening 117.

Figure 3:
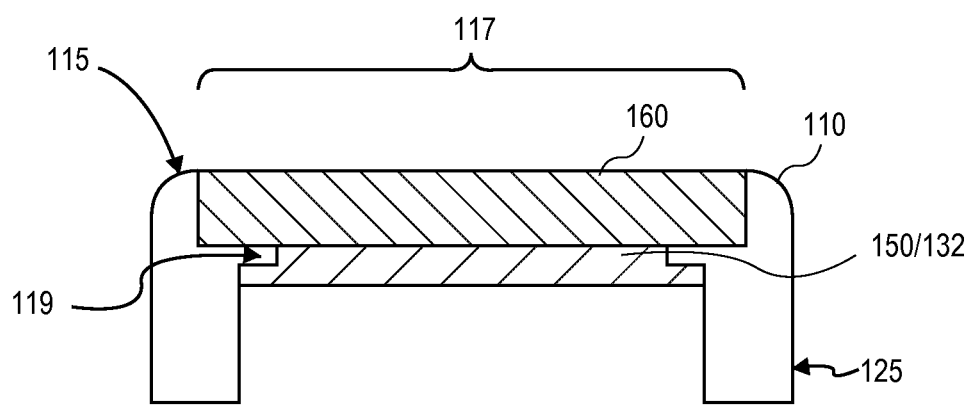
FIG. 3 is a side view of another embodiment of an integrated cold plate assembly including manifold and a channel module/base plate unitary body of FIG. 2.

FIG. 3 shows another embodiment of an integrated cold plate assembly. In this embodiment, a channel module and a base plate are integrated as a single unit (a unitary body). Referring to FIG. 3 where like reference numerals are used to indicate similar components, cold plate body 110 is formed as before with a generally rectangular cap portion 115 defining opening 117, shelf portion 119 protruding into opening 117 and sidewall portion 125 extending from cap portion 115. Manifold 160 is positioned in opening 117 of cold plate body 110 on shelf 119. Below manifold 160 is integrated channel module 150/base plate 132. Integrated channel module 150/base plate 132 is formed of a single thermally conductive material such as copper. One way to form a unitary body of a material such as a plate of copper is by a skiving technique. Integrated channel module 150/base plate 132 is shaped such that, in this embodiment, the channel module portion fits within the opening defined by shelf portion 119 to contact manifold 160 and the base plate portion of integrated channel module 150/base plate 132 contacts a base of shelf portion 119. Integrated channel module 150/base plate 132 can be connected to cold plate body 110 by introducing the integrated component from below shelf portion 119 and bonding the base plate portion to a base of shelf portion 119.

Referring to FIG. 1, channel module 150 includes a body and a plurality of channels projecting through the body in the direction of die 130. Representatively, channels 1500, 1505, 1510 and 1515 are shown extending through channel module 150 and, in this embodiment, are generally perpendicular to base plate 132. In one embodiment, the channels extend across an area requiring thermal management, such as an area encompassed by a surface of die 130 (top surface as viewed). As will be explained later, each of the channels alternately bring a cooling fluid toward die 130 for the purpose of heat transfer and the heated fluid exits therefrom for the purpose of heat transfer.

Overlying channel module 150 is manifold 160. Manifold 160 includes inlet 165 configured to introduce a fluid into a body of manifold 160 and outlet 170 configured to remove fluid from a body of manifold 160. Disposed within a body of manifold 160 is distributor assembly 175 and collector assembly 180. Distributor assembly 175 includes, in one embodiment, a number of distributors having openings in fluid communication with a portion of channels of channel module 150 (e.g., channels 1500, 1505, 1510 and 1515) including, in one embodiment, each of the channels. Similarly, collector assembly 180, in one embodiment, includes a number of collectors wherein respective ones of the collectors are in fluid communication with a portion of the channels of channel module 150. The distributors that make up distributor assembly 175 are connected to the inlet 165 and the collectors that make up collector assembly 180 are connected to outlet 170. Accordingly, in one embodiment fluid is configured to be introduced through inlet 165, through distributor assembly 175, through a body of manifold 160 into inlet channels of channel module 150 (e.g., channels 1500, 1505, 1510 and 1515). The fluid travels through the channels to base plate 132 and then out of the channels of channel module 150. The removed fluid (liquid or gas) travels through the body of manifold 160 and is collected in collector assembly 180 and removed from manifold 160 through outlet 170.

Referring again to FIG. 1, apparatus 100, in one embodiment, also includes a feedback loop to circulate cooling fluid and control its temperature. Representatively, a level of coolant is stored in reservoir 181. A suitable coolant is, for example, water. Another coolant is propendiol. Other coolants may also be suitable. Fluid flow from the reservoir 181 to manifold 160 is driven by pump 183. An optional chiller 182 may be placed downstream of reservoir 181. In one embodiment, pump 183 is controlled by controller 185 which is, for example, a pulse-width-modulation controller connected to an H-bridge. Downstream of pump 183 is optional flow filter 187 and flow meter 188. Flow meter 188, in one embodiment, is monitorable and controllable. Flow regime control is assisted with, for example, an H-bridge, that provides the capability to reverse the pump motor direction and apply braking/deceleration to quickly change a flow rate. Pulse-width-modulation input to a pump motor allows for precise control of the pump speed for flow rate control. As heat flux increases from die 130 and consequently the die temperature, a speed of pump 183 can increase to provide additional cooling. Likewise, as the die heat flux decreases, the pump speed may be decreased to target or maintain a constant die temperature. A temperature of the cooling fluid is measured by temperature gauge 190 that is, for example, a thermocouple. Components described with respect to the representative feedback loop may be positioned above manifold 160 or in an area away from manifold 160 and IHS 110 (e.g., on another area of printed circuit board 135). In the configuration where a representative feedback loop is positioned in an area away from manifold 160 and IHS 110, tubing may be used to bring fluid to inlet 165 and from outlet 170.

Figure 4:
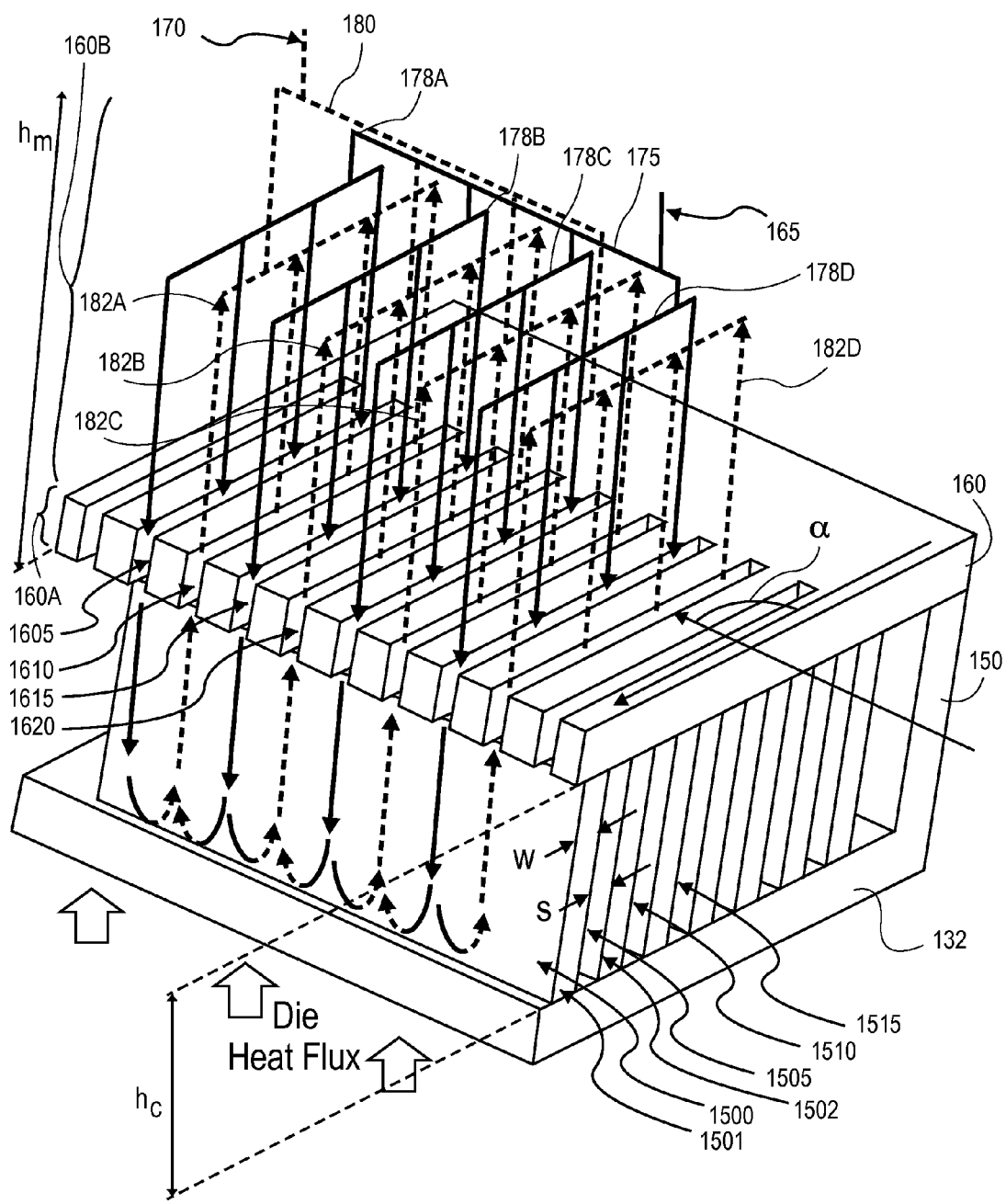
FIG. 4 is a top side sectional view of the manifold, channel module and base plate of the integrated cold plate assembly of FIG. 2.

FIG. 4 shows a sectional top side view of an embodiment of a channel module, manifold and base plate of an integrated cold plate. Channel module 150 is disposed between manifold 160 and base plate 132. Referring to FIG. 4, channel module 150 includes a number of laterally disposed channels extending across a width of the channel module body. Channels 1500, 1505, 1510 and 1515 are identified and shown projecting through the body of channel module 150 such that the channels are exposed to manifold 160 and base plate 132. The channels are used to bring fluid toward base plate 132 which is adjacent to a heat source (e.g., an integrated circuit chip or die) and return fluid therefrom. The sectional view exposes channel 1500 to view a fluid flow through the channel.

The channels of channel module 150 are defined by individual fins (fins 1501 and 1502 identified by reference numerals) have a representative width, w, on the order of 20 to 500 microns. The fins define a spacing, S, between the channels. A representative spacing, S, is on the order of 20 to 500 microns. In operation, an introduced fluid flows through the channels to a top side of base plate 132. The introduced fluid is at a temperature less than a temperature at a top side of base plate 132 and the walls of the channels due to heat generated by die 130 and transferred through baseplate 132 (see FIG. 1). The difference in temperature allows heat transfer to occur. Heat is transferred from the walls of the channels and from base plate 132 to the fluid and the heated fluid flows out of the channel. A height, $h_c$, of channel module 150 may be targeted to achieve maximum heat transfer. A representative height, $h_c$, may range from 100 microns to 3 millimeters depending on dimensions of the channels.

Figure 5:
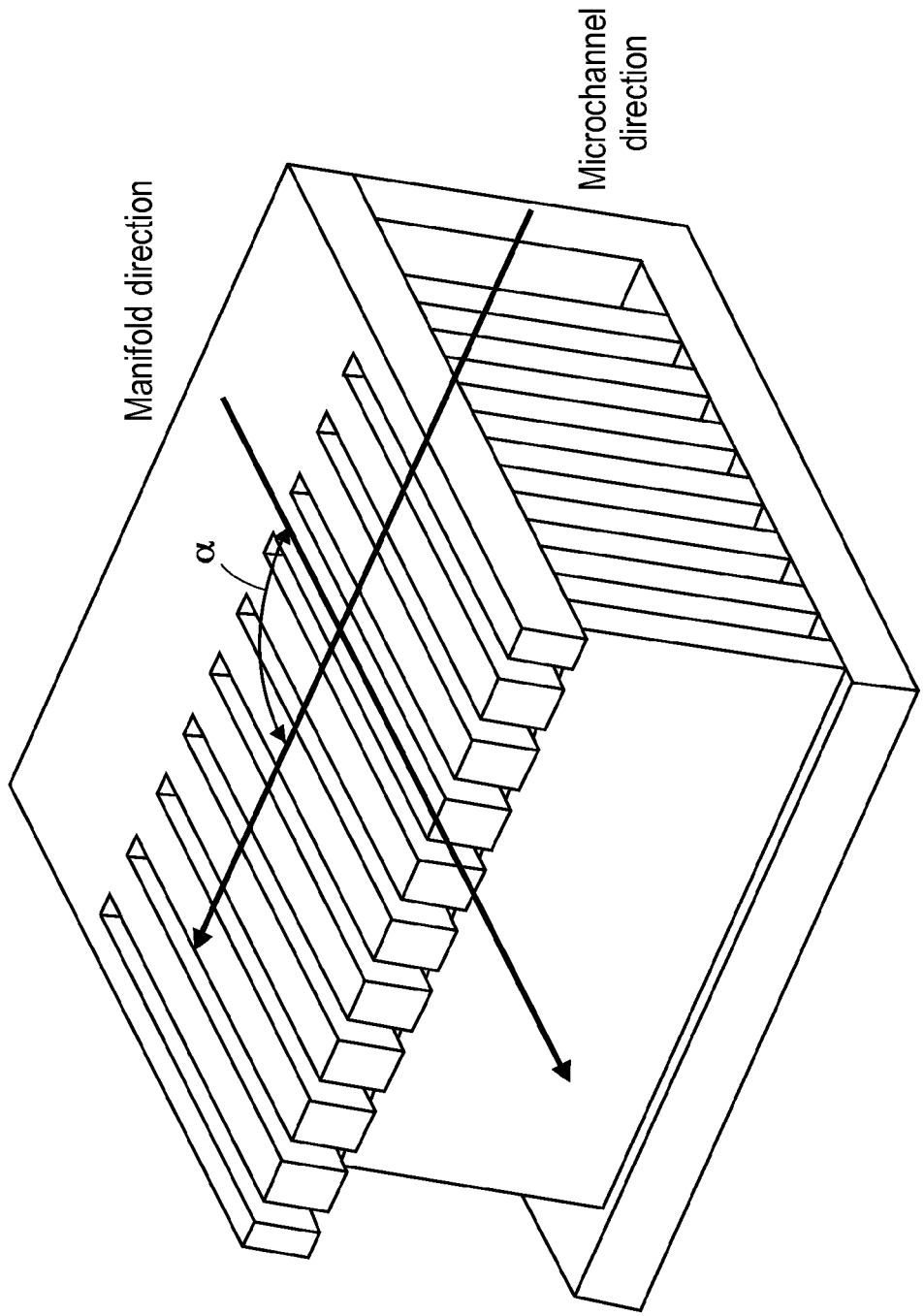
FIG. 5 is another top side sectional view of the manifold, channel module and base plate of the integrated cold plate assembly of FIG. 2.

FIG. 4 also shows manifold 160 disposed over channel module 150. In this embodiment, manifold 160 includes an interface portion (portion 160A) that interfaces with channel module 150 and a distribution/collection portion (portion 160B). Manifold 160 includes a number of apertures or slots extending about a length of the body. As viewed, apertures or slots 1605, 1610, 1615 and 1620 are oriented, in this embodiment, such that they define an angle, α(see FIG. 5), that is perpendicular to channels in channel module 150 (e.g., channels 1500, 1505, 1510 and 1515). In another embodiment, the apertures or slots of manifold 160 may be at an angle, α of 45° up to 90° relative to channels in channel module 150. In one embodiment, manifold 160 has a height, $h_m$, targeted to keep a pressure drop low and distribute flow in a uniform manner over the channels of channel module 150. In one embodiment, it is desirable to keep a height, $h_m$, of manifold 160 under 20 millimeters to minimize a total thickness of the integrated cold plate.

In one embodiment, fluid is introduced into alternating inlet apertures or slots (e.g., slots 1605 and 1615) of manifold 160 and returned through alternating outlet apertures or slots (e.g., slots 1610 and 1620) with inlet slots being adjacent outlet slots. An inlet fluid such as water is introduced through inlet port 165 into supply distributor assembly 175 which distributes the fluid to inlet apertures or slots across the manifold. In one embodiment, distributor assembly 175 includes a number of distributors (e.g., distributors 178A, 178B, 178C and 178D) positioned over inlet apertures or slots of manifold 160. The distributors deliver fluid to respective inlet apertures or slots in a body of manifold 160 (e.g., slots 1605 and 1615) and the fluid flows through the apertures or slots to channels (e.g., channels, 1500, 1505, 1510 and 1515) in channel module 150. Thus, respectively the distributors are in fluid communication with channels in channel module 150 as described with reference to FIG. 1.

Manifold 160 also includes collector assembly 180 including a number of collectors (e.g., collectors 182A, 182B, 182C, 182D) that are positioned over outlet apertures or slots. The collectors collect fluid returned to outlet apertures or slots (e.g., outlet slots 1610 and 1620) from channel module 150. In this manner, the collectors are in fluid communication with respective outlet apertures or slots and channels (e.g., channels 1500, 1505, 1510 and 1515) of channel module 150. The collected fluid is removed from manifold 160 (from collector assembly 180) through outlet 170. In one embodiment, distributor assembly 175 including the distributors is formed of tubing in a body of manifold 160 with each distributor having one or more openings (optionally with nozzle) to deliver fluid to inlet slots. Similarly, collector assembly 180 including the collectors is formed of tubing in a body of manifold 160, with each collector including an opening to collect fluid from the outlet slots. In another embodiment, distributor assembly 175 and collector assembly 180 are pathways (e.g., channels or conduits formed in a body of manifold). In an embodiment where manifold 160 is a thermoplastic, for example, the manifold including conduits of a distributor and a collector assembly can be formed through molding techniques.

In the embodiment shown in FIG. 4, the interface between channel module 150 and manifold 160 are apertures or slots (e.g., slots 1605, 1610, 1615 and 1620) extending perpendicular relative to the channels of the channel module. The fluid is distributed through distributor assembly 175 and into inlet apertures or slots of the manifold. Once through the apertures or slots, the fluid then enters channels of the channel modules. The fluid then flows along the channels with an in-plane travel of liquid providing convection cooling. After the in-plane flow, the heated fluid returns through the channels into outlet apertures or slots of manifold 160 and into collector assembly 180.

The integrated cold plate with integrated thermal management as described is suitable for use in a computing device in accordance with one implementation. Such a computing device will house a printed circuit board (e.g., computing device 105 housing board 135 in FIG. 1). The board may include a number of components, including but not limited to an integrated cold plate and processor or processors with the processor(s) physically and electrically connected to the board. Depending on its applications, a computing device may include other components that may or may not be physically and electrically coupled to the board. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The thermal management system described is particularly useful in high power processing systems such as servers which are physical computers (computer hardware systems) dedicated to run one or more services (e.g., as a host). The thermal management system described can also be used in other processing environments. Thus, in various implementations, a computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, a computing device may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An apparatus comprising: a cold plate body comprising a cap portion having an opening therein, a sidewall portion extending from the cap portion and a shelf portion protruding a distance inward into the opening; a channel module disposed within the cold plate body comprising a channel body and a plurality of laterally disposed fins with a spacing between the fins defining a plurality of channels through the channel body and extending across the channel body; and a manifold disposed on the channel module and disposed a distance within the cold plate body to contact the shelf, the manifold comprising an inlet and an outlet and a plurality of apertures, wherein each of the plurality of apertures is in fluid communication with each of the plurality of channels of the channel module and wherein first ones of the plurality of apertures are in fluid communication with the inlet and second ones of the plurality of apertures are in fluid communication with the outlet.

2. The apparatus of claim 1, wherein the manifold is disposed in the opening of the cap portion.

3. The apparatus of claim 1, further comprising a base plate coupled to the channel module such that the channel module is disposed between the manifold and the base plate and wherein the plurality of channels in the channel module project through the channel body in a direction toward the base plate.

4. The apparatus of claim 3, wherein the channel module and the base plate are a unitary body of a thermally conductive material.

5. The apparatus of claim 1, wherein respective ones of the first ones of the plurality of apertures that are in fluid communication with the inlet of the manifold are adjacent respective others of the second ones of the plurality of apertures that are in fluid communication with the outlet.

6. The apparatus of claim 5, wherein the manifold comprises a plurality of distributors in fluid communication with the inlet and the first ones of the plurality of apertures, and a plurality of collectors in fluid communication with the outlet and the second ones of the plurality of apertures.

7. The apparatus of claim 6, wherein the plurality of distributors and the plurality of collectors extend in a perpendicular direction relative to the plurality of channels of the channel module.

8. A method comprising: introducing a fluid to an integrated cold plate disposed on an integrated circuit device, the integrated cold plate comprising a cold plate body comprising a cap portion having an opening and a sidewall portion extending from the cap portion about the integrated circuit device, and a shelf portion protruding a distance inward into the opening, the fluid being introduced into a manifold disposed in the cold plate body, the manifold disposed a distance within the cold plate body to contact the shelf and in fluid communication with a channel module disposed between the manifold and a base plate, the channel module positioned in the opening of the cap portion, and comprising a plurality of laterally disposed channels each extending across the channel module to direct the fluid toward the base plate, wherein the manifold comprises a plurality of apertures in fluid communication with each of the plurality of channels of the channel module, first ones of the plurality of apertures operable to provide the introduced fluid to each of the plurality of channels and separate second ones of the plurality of apertures operable to receive the introduced fluid from each of the plurality of channels; and collecting the fluid returned to the manifold.

9. The method of claim 8, wherein the manifold comprises a plurality of distributors wherein respective ones of the plurality of distributors are in fluid communication with at least a portion of the channels, wherein introducing the fluid into the manifold comprises introducing the fluid into the respective ones of the plurality of distributors.

10. The method of claim 9, wherein the plurality of distributors are in fluid communication with a first portion of the channels and the manifold comprises a plurality of collectors, wherein respective ones of the plurality of collectors are in fluid communication with at least a second portion of the channels that is different than the first portion of the channels, wherein collecting the fluid comprises collecting the fluid from the collectors.

11. The method of claim 8, wherein the channel module and the base plate comprise a unitary body of a thermally conductive material.

12. An apparatus comprising: an integrated circuit device; a cold plate body comprising a cap portion having an opening and a sidewall portion extending from the cap portion about the integrated circuit device, and a shelf portion protruding a distance inwards into the opening; a channel module positioned in the opening of the cap portion of the cold plate body, the channel module comprising a channel body and a plurality of channels projecting through the channel body and each extending across the channel body; and a manifold disposed on the channel module, the manifold disposed a distance within the cold plate body to contact the shelf and within the opening of the cold plate body, the manifold comprising an net and an outlet and a plurality of apertures, wherein each of the plurality of apertures is in fluid communication with each of the plurality of channels of the channel module and wherein first ones of the plurality of apertures are in fluid communication with the net and second ones of the plurality of apertures are in fluid communication with the outlet.

13. The apparatus of claim 12, wherein the cold plate body further comprises a base plate and the channel module is disposed between the manifold and the base plate and wherein the plurality of channels in the channel module project through the channel body in a direction toward the base plate.

14. The apparatus of claim 12, wherein the channel module and the base plate comprise a unitary body of a thermally conductive material.

15. The apparatus of claim 12, wherein respective ones of the first ones of the plurality of apertures that are in fluid communication with the inlet of the manifold are adjacent respective others of the second ones of the plurality of apertures that are in fluid communication with the outlet.

16. The apparatus of claim 12, wherein the manifold comprises a plurality of distributors in fluid communication with the inlet and the first ones of the plurality of apertures, and a plurality of collectors in fluid communication with the outlet and the second ones of the plurality of apertures.

17. The apparatus of claim 12 further comprising a printed circuit board, wherein the integrated circuit device is coupled to the printed circuit board.

* * * * *

UNITED STATES PATENT AND TRADEMARK OFFICE
CERTIFICATE OF CORRECTION

PATENT NO. : 9,477,275 B2  
APPLICATION NO. : 13/745553  
DATED : October 25, 2016  
INVENTOR(S) : Choudhury et al.

Page 1 of 1

It is certified that error appears in the above-identified patent and that said Letters Patent is hereby corrected as shown below:

In the Claims  
In Column 8, at Line 18, delete "net" and insert --inlet--.  
In Column 8, at Line 23, delete "net" and insert --inlet--.

Signed and Sealed this  
Thirty-first Day of January, 2017

Michelle K. Lee  
*Director of the United States Patent and Trademark Office*